United States Patent [19]

Nemazie

[11] Patent Number: 5,523,979
[45] Date of Patent: Jun. 4, 1996

[54] SEMICONDUCTOR MEMORY DEVICE FOR BLOCK ACCESS APPLICATIONS

[75] Inventor: Siamack Nemazie, San Jose, Calif.

[73] Assignee: Cirrus Logic, Inc., Fremont, Calif.

[21] Appl. No.: 421,653

[22] Filed: Apr. 13, 1995

[51] Int. Cl.[6] ................................................. G11C 8/00
[52] U.S. Cl. .................... 365/230.05; 365/230.09; 365/239; 365/240
[58] Field of Search .................. 365/230.03, 230.05, 365/230.09, 239, 240

[56] References Cited

U.S. PATENT DOCUMENTS

| | | | |
|---|---|---|---|
| 4,541,075 | 9/1985 | Dill et al. | 365/189 |
| 4,616,310 | 10/1986 | Dill et al. | 365/230.05 |
| 5,179,372 | 1/1993 | West et al. | 365/230.05 X |
| 5,260,905 | 11/1993 | Mori | 365/230.05 |
| 5,313,431 | 5/1994 | Uruma et al. | 365/230.05 |

Primary Examiner—David C. Nelms
Assistant Examiner—Son Dinh
Attorney, Agent, or Firm—Maryam Imam

[57] ABSTRACT

A semiconductor memory device is disclosed including a main memory configured as a dynamic random access memory array having rows and columns, combined with a secondary memory having a data register file, a transferring circuit for allowing transfer of data between the main memory and secondary memory, a first parallel-by-bit interface for random accesses to the main memory and a second parallel-by-bit interface for access to the seconday memory. Concurrent and independent accesses of the main and secondary memories is achieved while maintaining the integrity of data. Further included in the secondary memory is a data register file and a corresponding mask register file wherein the latter achieves selection of any combination of words in a row of the secondary memory for the purposes of transferring the same to the main memory.

28 Claims, 13 Drawing Sheets

SEMICONDUCTOR MEMORY DEVICE FOR BLOCK ACCESS APPLICATIONS

RELATED PATENT APPLICATIONS

This application is related to a U.S. patent application by the title of "Semiconductor Memory Device for Mass Storage Block Access Applications" having Ser. No. 08/421,652 filed on Feb. 13, 1995.

FIELD OF THE INVENTION

This invention relates to integrated circuit semiconductor memories employed in block access applications.

BACKGROUND OF THE INVENTION

Semiconductor memories are often employed in systems with a need to transfer blocks of information from one location or peripheral to another thereby serving as temporary storage locations. Any limitations of such memories effect system performance in terms of speed and efficiency. For example, throughput of systems employing prior art memory is substantially reduced when the system's peripheral or utilization devices are restricted in accessing blocks of information from the memory concurrently. Discussion of prior art memory architectures in specific applications will aid in understanding reasons for the reduction of system performance due to memory design limitations.

FIG. 1 shows an application specific memory according to U.S. Pat. No. 4,541,075, by Dill et al. where the memory is a semiconductor or IC device. Dill employs a main memory array coupled to a port and arranged in rows and columns, each row having the same number of n-bit wide words. Additionally incorporated in the semiconductor memory is a row buffer register which can transfer rows of data between the main memory and a second Input/Output port for accessing the row buffer register in either serial or parallel mode. A limitation of the memory device described in Dill is that only one utilization device can independently use the second I/O port. Furthermore, writing of a selected n-bit wide word sometimes referred to as partial write or masked write, from the row buffer register to a row of the main memory can not be achieved by the memory device proposed by Dill et al. In this memory device the partial write can be emulated by a "memory row read modify write" operation which includes the steps of: transferring the row from the main memory to the row buffer register, modifying the row buffer register through the second I/O port, and transferring the row buffer register back to the row of the main memory. This "memory row read modify write" operation assumes that the data of the same row in the main memory was not changed between the read and write back. Note that data corruption will occur if during a "memory row read modify write" operation, part of the data in the main memory row was modified through the first I/O port (the port coupled to the main memory). This is a general limitation of the prior art and will be discussed in more detail below.

A major limitation in providing access by multiple independent utilization devices through a dedicated port per utilization device to a dedicated row buffer register is that concurrent write to the same row of the main memory by two or more utilization devices is not possible because partial write is not supported. FIG. 2 shows an extension of the memory device taught by Dill et al. including yet a third I/O port for accessing a second row buffer independent of the first row buffer for use by a second utilization device.

FIG. 3 shows two blocks in the main memory wherein the tail end of block 1 and beginning of block 2 are in the same row of the main memory (row 2). Consider an application in which the first utilization device is using the first row buffer register through the second I/O port and a second utilization device is using the second row buffer register through the third I/O port, and furthermore utilization device 1 is accessing block 1, and utilization device 2 is accessing block 2. Now consider the following sequence of operations in this example: utilization device 1 reads row 2 of the memory into the first row buffer register and starts modifying the first row buffer register through the second I/0 port, utilization device 2 reads the same row of memory into the second row buffer register and starts modifying the second row buffer register through the third I/0 port. Utilization device 1 completes modifying the beginning of the row buffer register which is part of block 1 and writes it back to the row of the memory, utilization device 2 completes modifying the tail end of the second row buffer register which is part of the block 2 and writes it back to the row of the memory. It should be apparent that the last operation will then overwrite the data of block 1 which was modified by utilization device 1, and causes data corruption.

While problems as discussed above such as data corruption, etc. can be avoided, this is only achieved at the cost of limiting memory utilization by requiring that either the size of the block of data to be a multiple of a row size (which may not always be possible) or waste portions of the memory.

Furthermore, multiple parallel-by-bit I/O ports each coupled to a utilization device increases the number of pins of the memory device package, which increases cost of the memory device.

The semiconductor memory as taught by the present invention resolves limitations of prior art memories to achieve higher system performance. An application of the present invention as taught in a related patent application with a title of Semiconductor Memory Device for Mass Storage Block Access applications and Ser. No. 08/421,652, would be in disc drives where there is a need for a cost effective high performance multiport memory for allowing independent accesses to the memory by multiple peripherals or utilization devices.

BRIEF SUMMARY OF THE INVENTION

The present invention includes a semiconductor memory device having multi-port accessing capability for increasing the efficiency and throuput of systems in which it is employed. More specifically, in applications where information needs to be transferred in blocks of data, the semiconductor memory device provides a means for simultaneously and independently accessing such blocks by various utilization or peripheral devices located externally to the memory.

An object of this invention is to increase the effective transfer rate of a semiconductor memory.

Another object of this invention is to provide access to random access memory through first and second pods for increasing the effective transfer rate of the memory device.

Yet another object of the present invention is to separate sequential memory access by multiple independent utilization devices through the second port from the random memory access through the first port.

According to the present invention, a semiconductor memory device is configured to provide improved system performance in block oriented applications such as storage subsystem. Specifically, the present invention includes a main memory configured as a dynamic random access memory array, combined with a secondary memory having a data register file and a mask register file, a second parallel-by-bit interface for random accesses to the data and mask register files, and circuit for transferring data between the main memory array and the data register file. It is obvious to people of ordinary skill in the art that static random access memories can be employed as the main memory without departing from the spirit of the invention.

According to the present invention, data from a row of the main memory array can be transferred on a column-by-column basis into a register of the data register file, each of which have the same number of bits as in a row of the main memory array. Furthermore any combination of words within a register of the data register file, can be transferred into a row of the main memory array, wherein the combination of the words is selected by the contents of corresponding register of the mask register file.

An important aspect of the present invention is that sequential accesses are performed through the second interface and the data register file, and furthermore random access to any word within the register files can be performed through the second interface.

Furthermore in order to minimize the accesses to the mask register file a simultaneous write operation, and a write reset operation to the register files are invented. In the simultaneous write operation when writing to a word of data register file a predetermined pattern is simultaneously written to the corresponding word of the mask register file. This pattern corresponds to selecting all bits of the word when transferring with mask from data register file to the main memory. In the write reset operation a second predetermined pattern is written to all the bits of the selected register of the register files. The second predetermined pattern corresponds to a pattern deselecting all the bits when transferring with mask from data register file to the main memory.

In another embodiment of the present invention, independent sequential addressing of each register of the register file is included, which provides the address to select a word within a register of the register file during accesses to the register file through the second interface.

These and other objects, advantages, aspects and features of the present invention will be more fully understood and appreciated by those skilled in the art upon consideration of the following detailed description of a specific embodiment, presented in conjunction with the accompanying drawings.

BRIEF DESCRIPTIONS OF THE DRAWINGS

Figure 6:
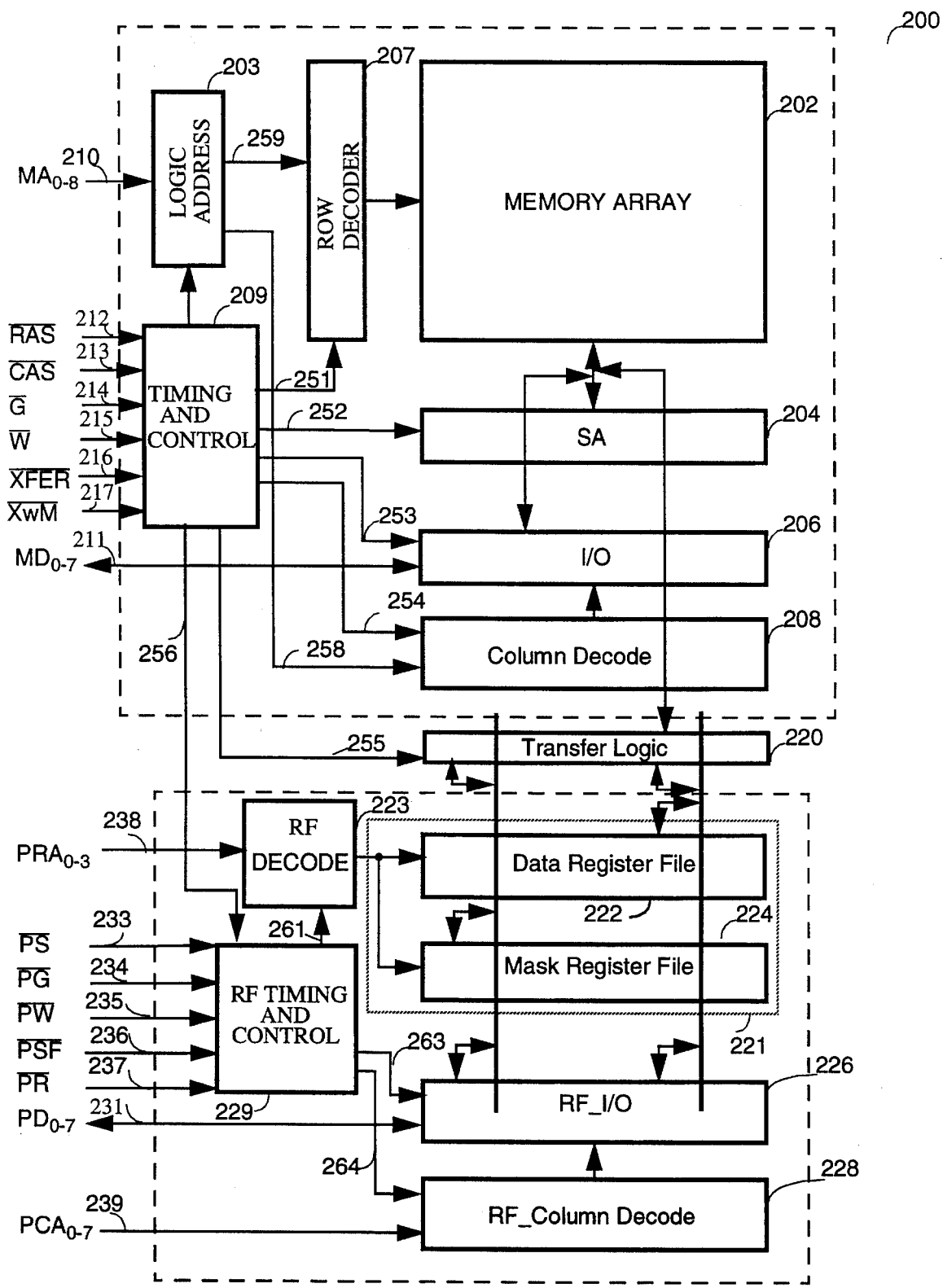
Figure 7:
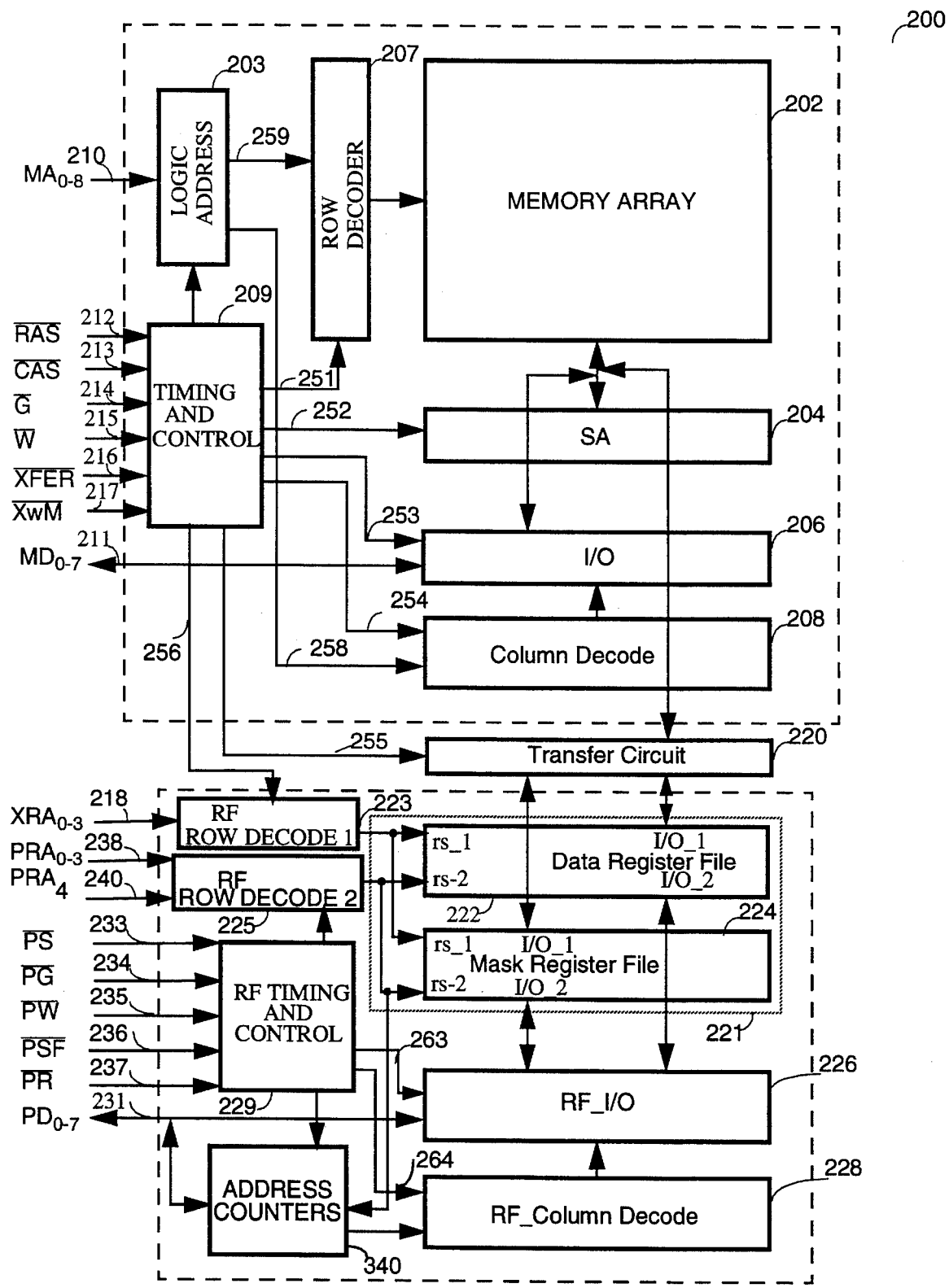
Figure 8:
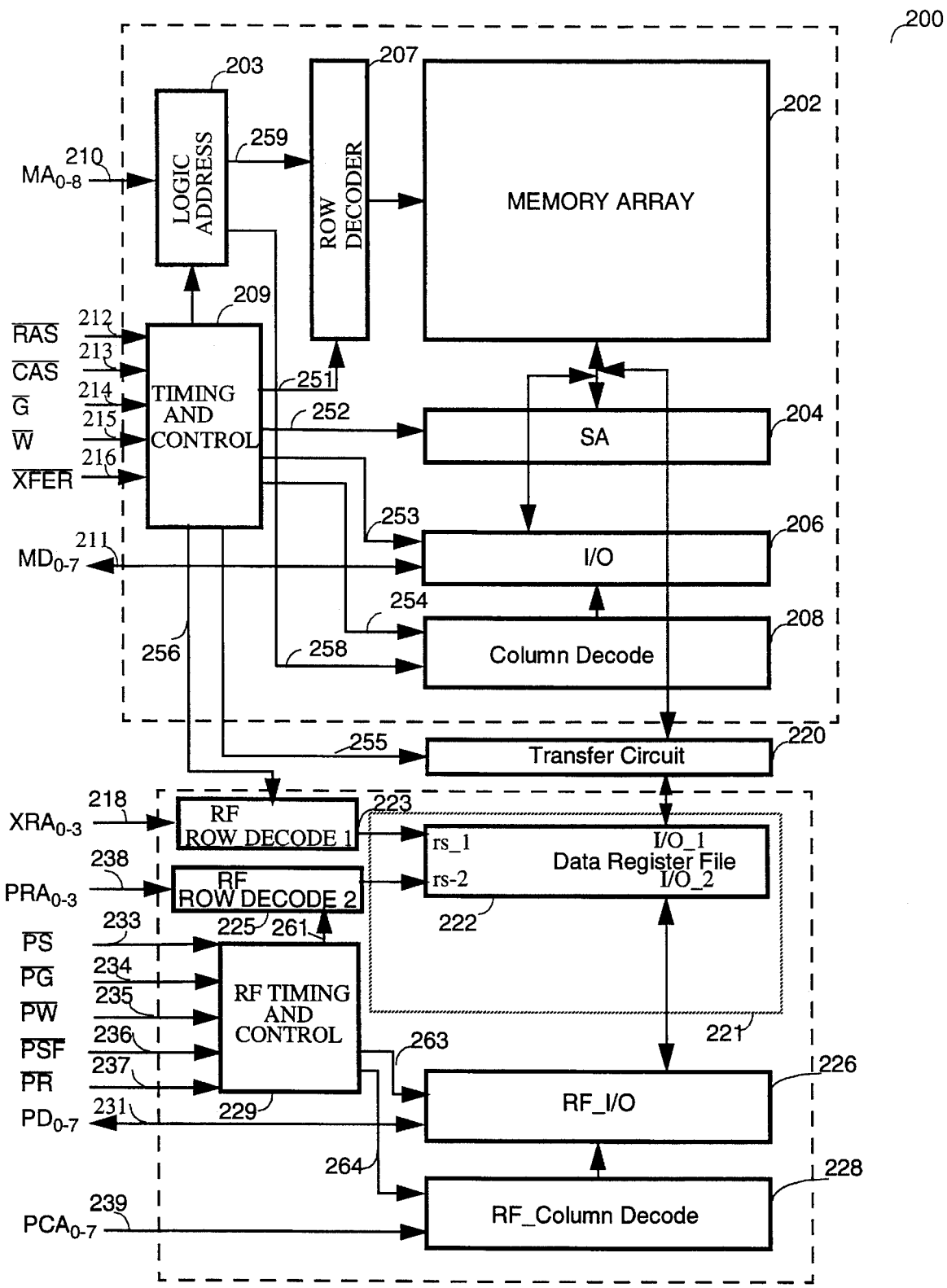

FIG. 6 is a block diagram of yet another embodiment of the invention using single port register file for the secondary memory FIG. 7 is a block diagram of yet another embodiment of the invention having an address counter for sequential addressing of registers of the register file FIG. 8 is a block diagram of yet another embodiment of the invention for having only a data register file specifically for applications wherein each block consists of one or more complete rows of the main memory.

Figure 9:
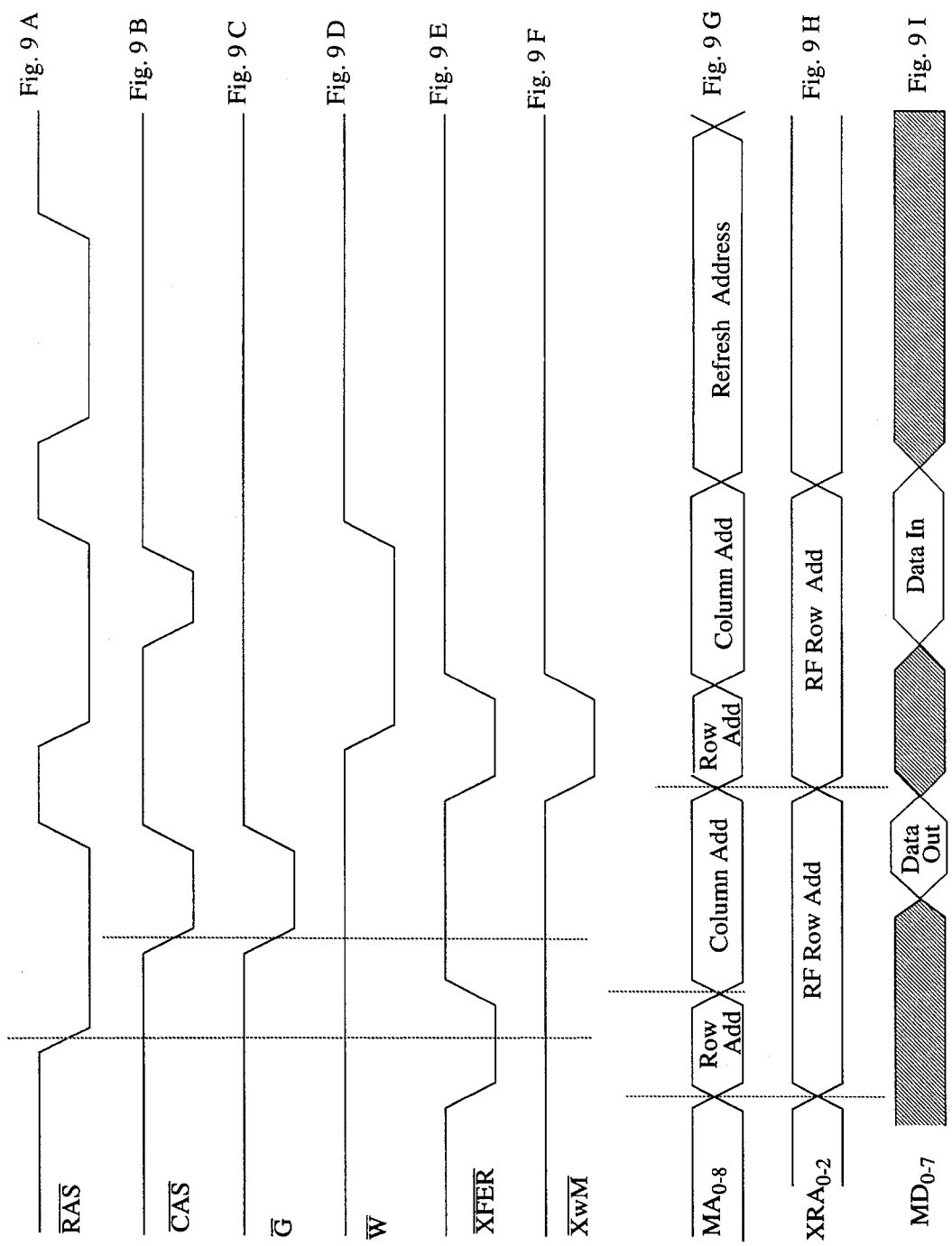
Figure 10A:
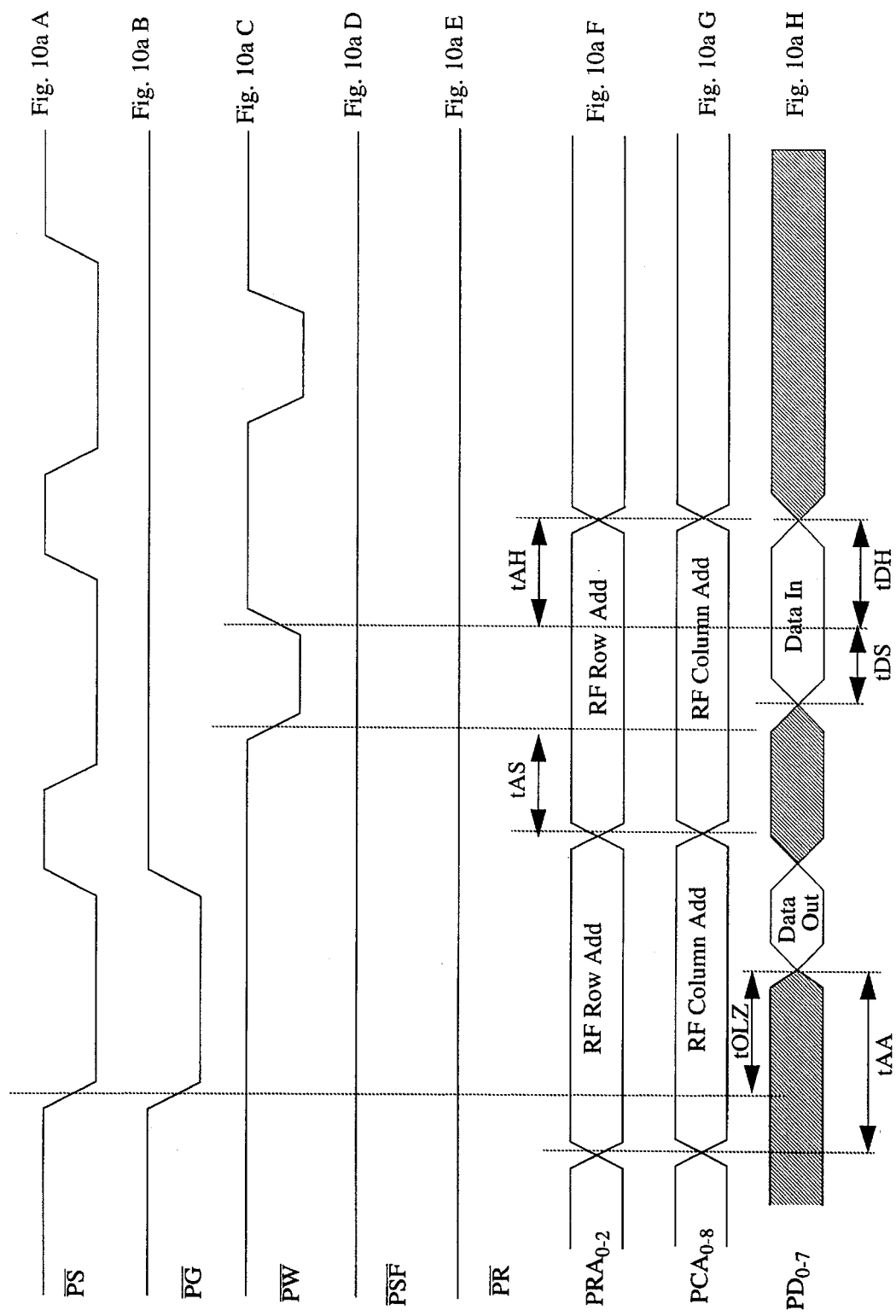
Figure 10B:
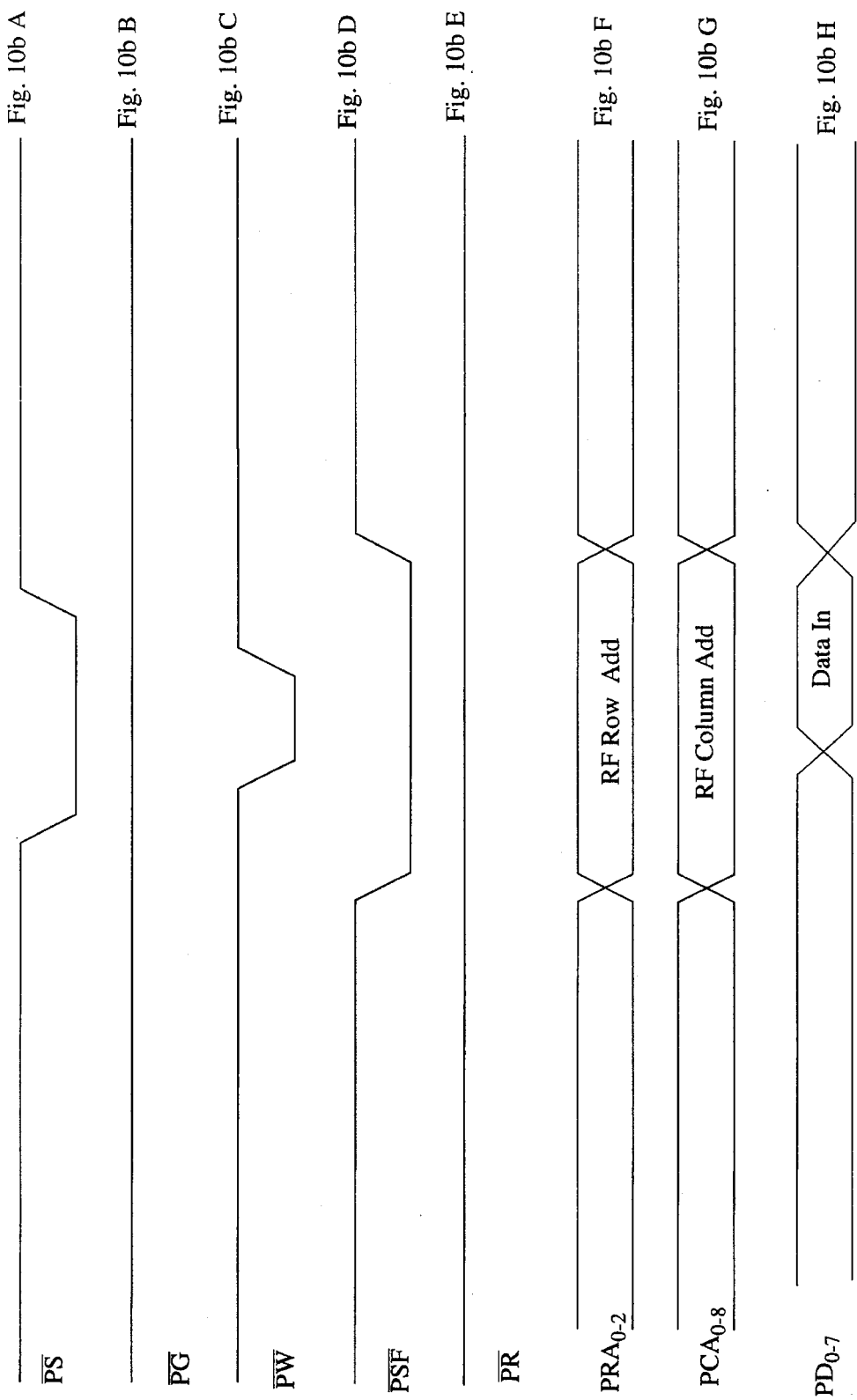
Figure 10C:
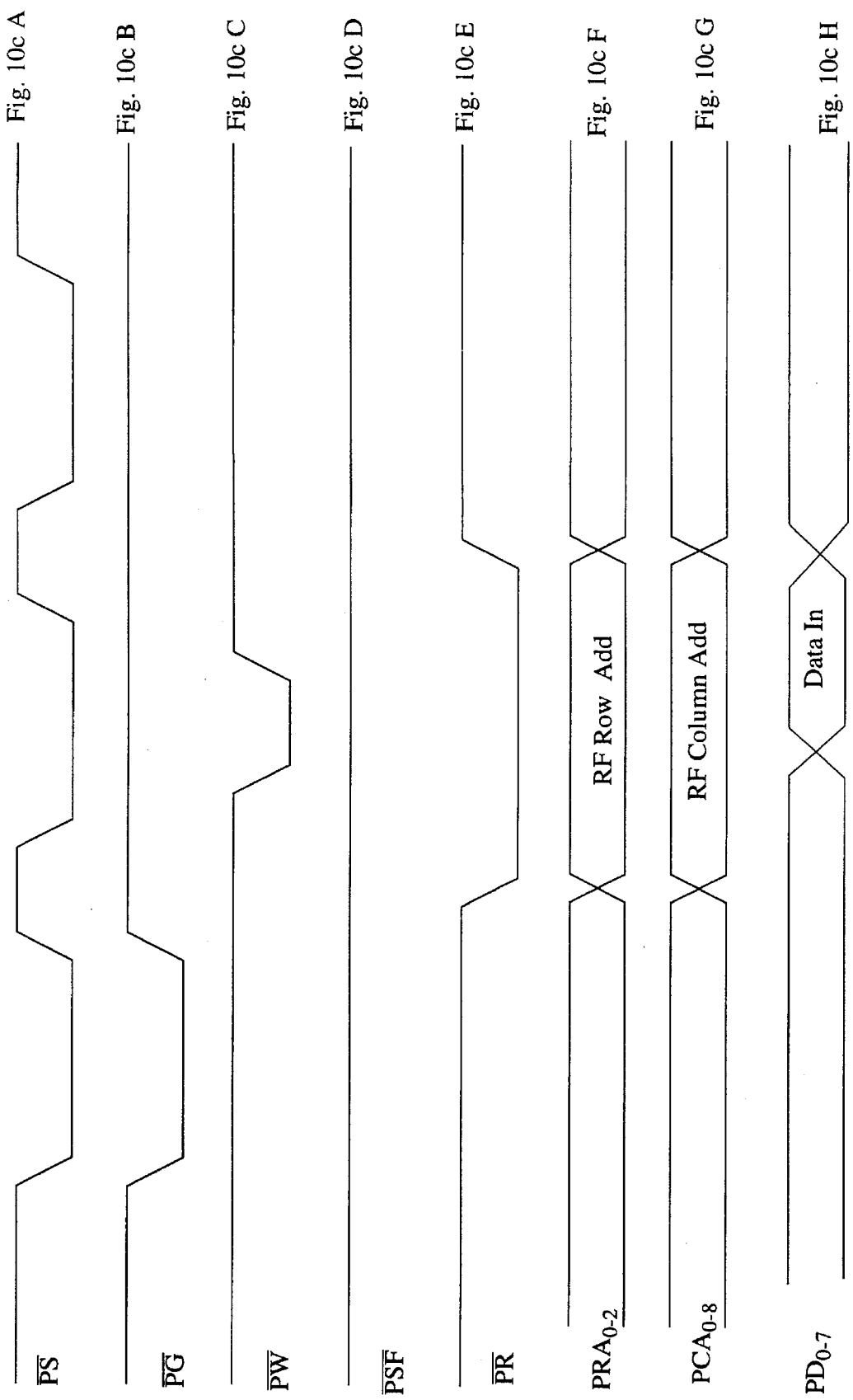
Figure 11:
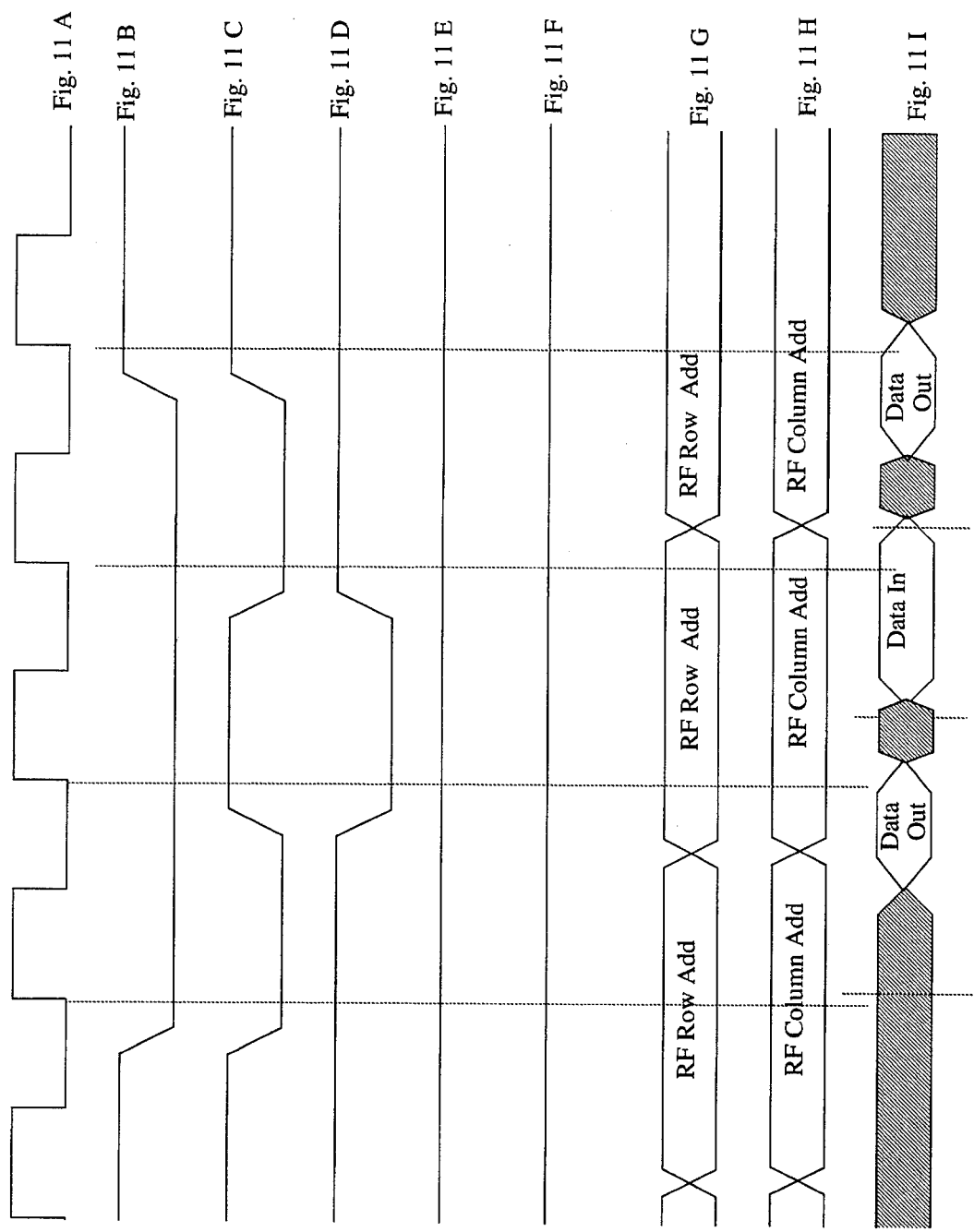

FIG. 9 illustrates the timing diagram for transferring between the main memory and the secondary memory FIG. 10a illustrates the timing diagram of read and write operation of the secondary memory FIG. 10b illustrates the timing diagram of simultaneous write operation of the secondary memory FIG. 10c illustrates the timing diagram of write reset operation of the secondary memory FIG. 11 illustrates the timing diagram of synchronous read and write operations of the secondary memory

DETAILED DESCRIPTION OF A SPECIFIC EMBODIMENT

Figure 1:
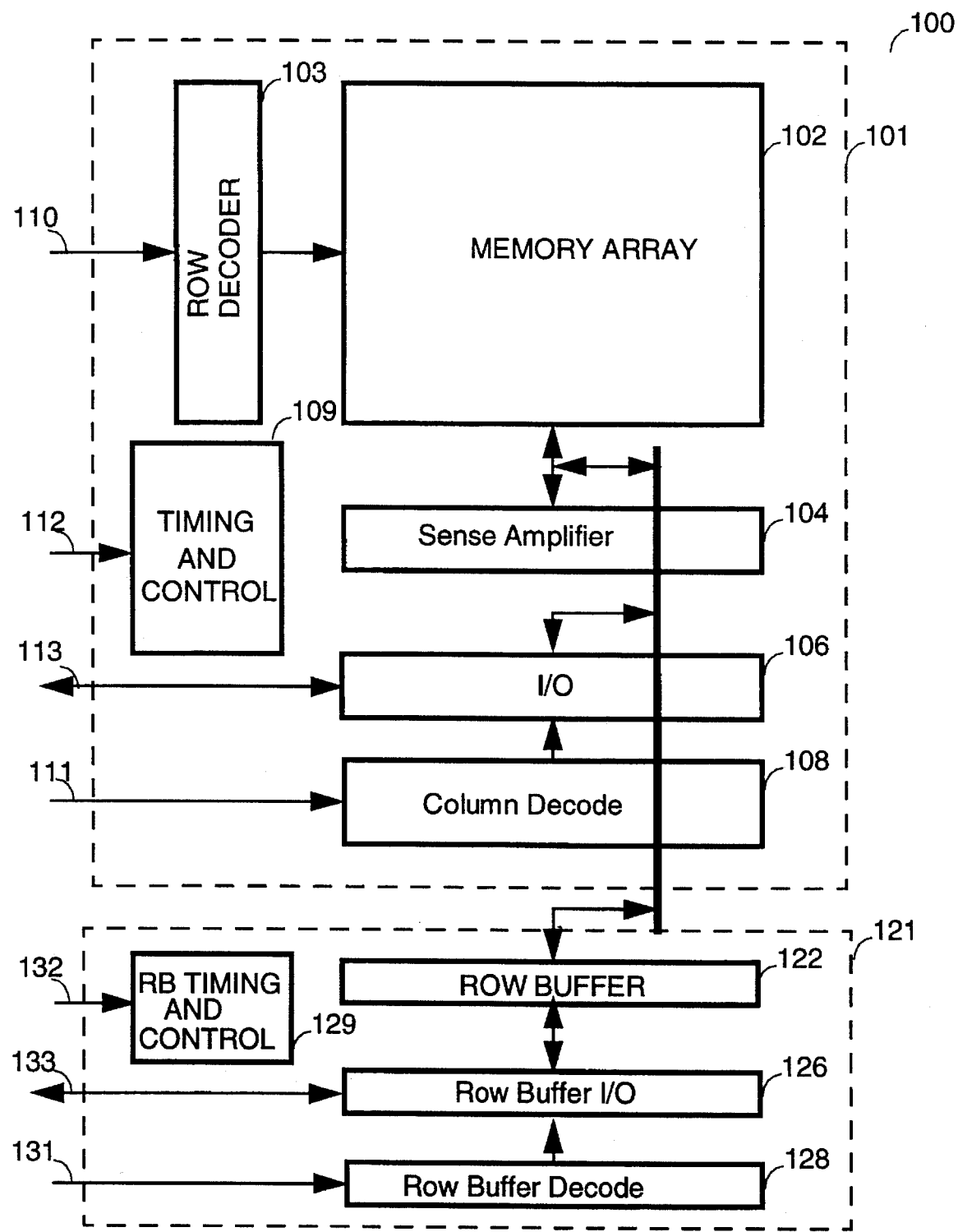
FIG. 1 shows the block diagram of a multiport DRAM of prior art
Figure 2:
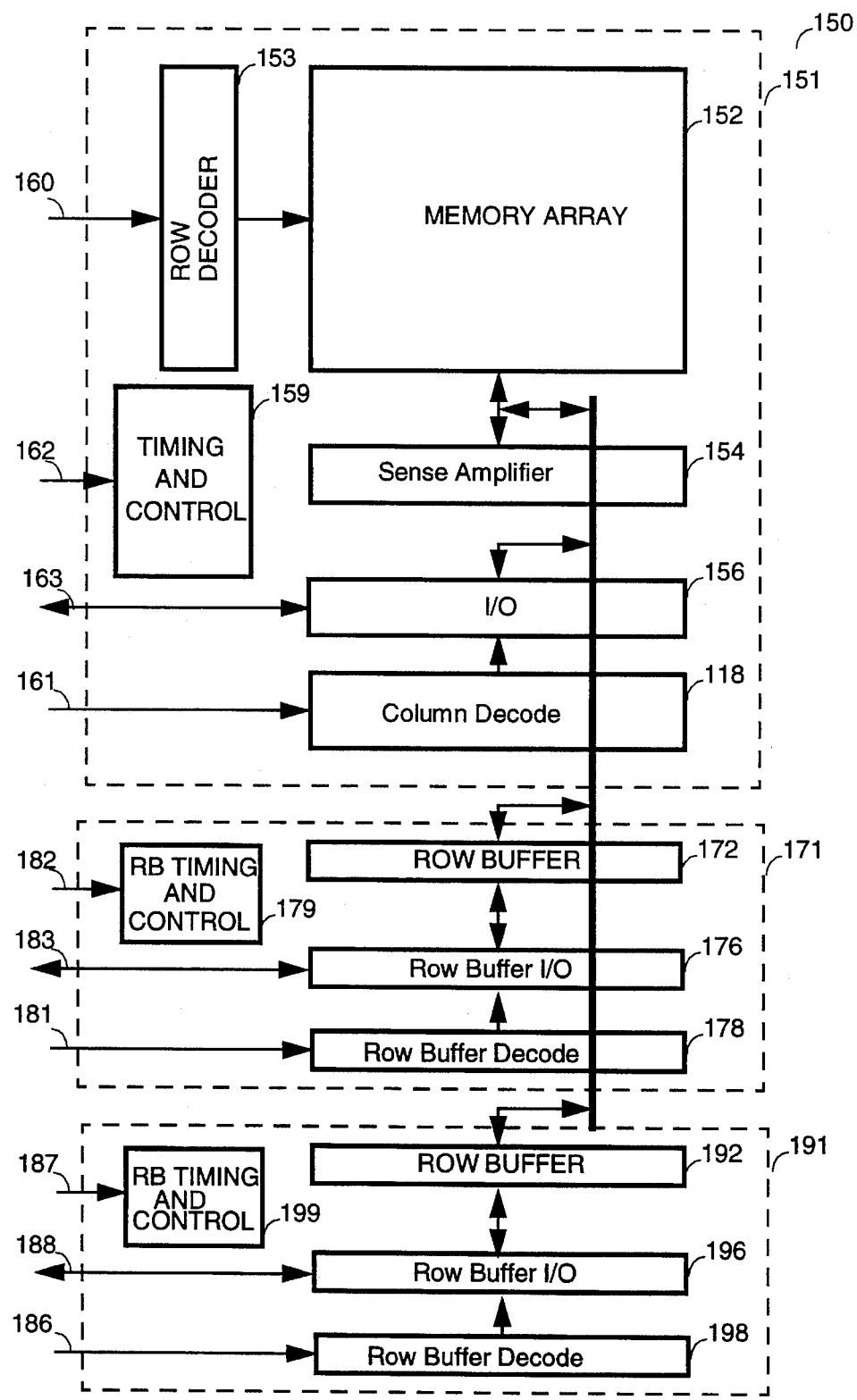
FIG. 2 shows an extension of multiport DRAMs of prior art
Figure 3:
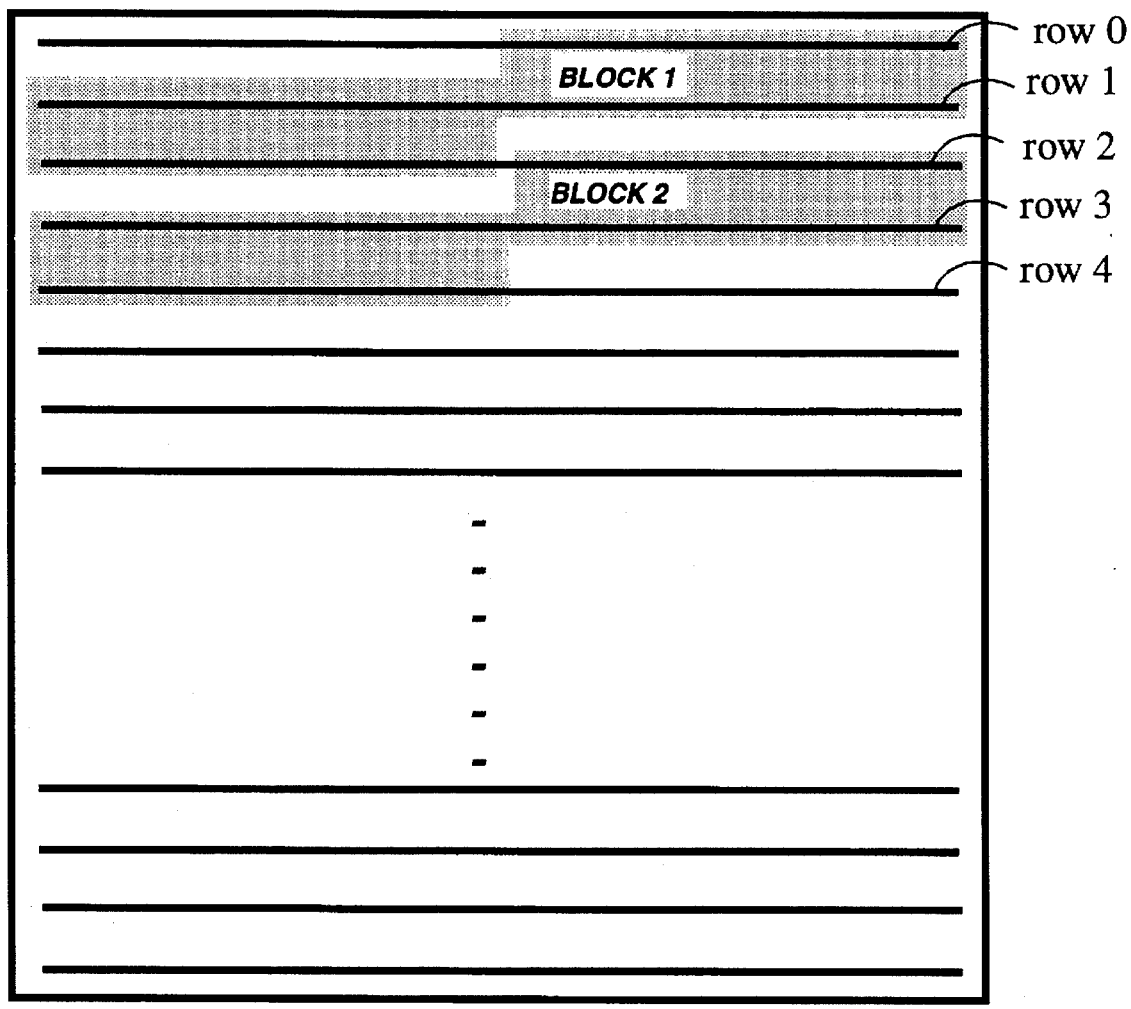
FIG. 3 shows two blocks of data in the memory wherein a row of the memory partially is included in both
Figure 4:
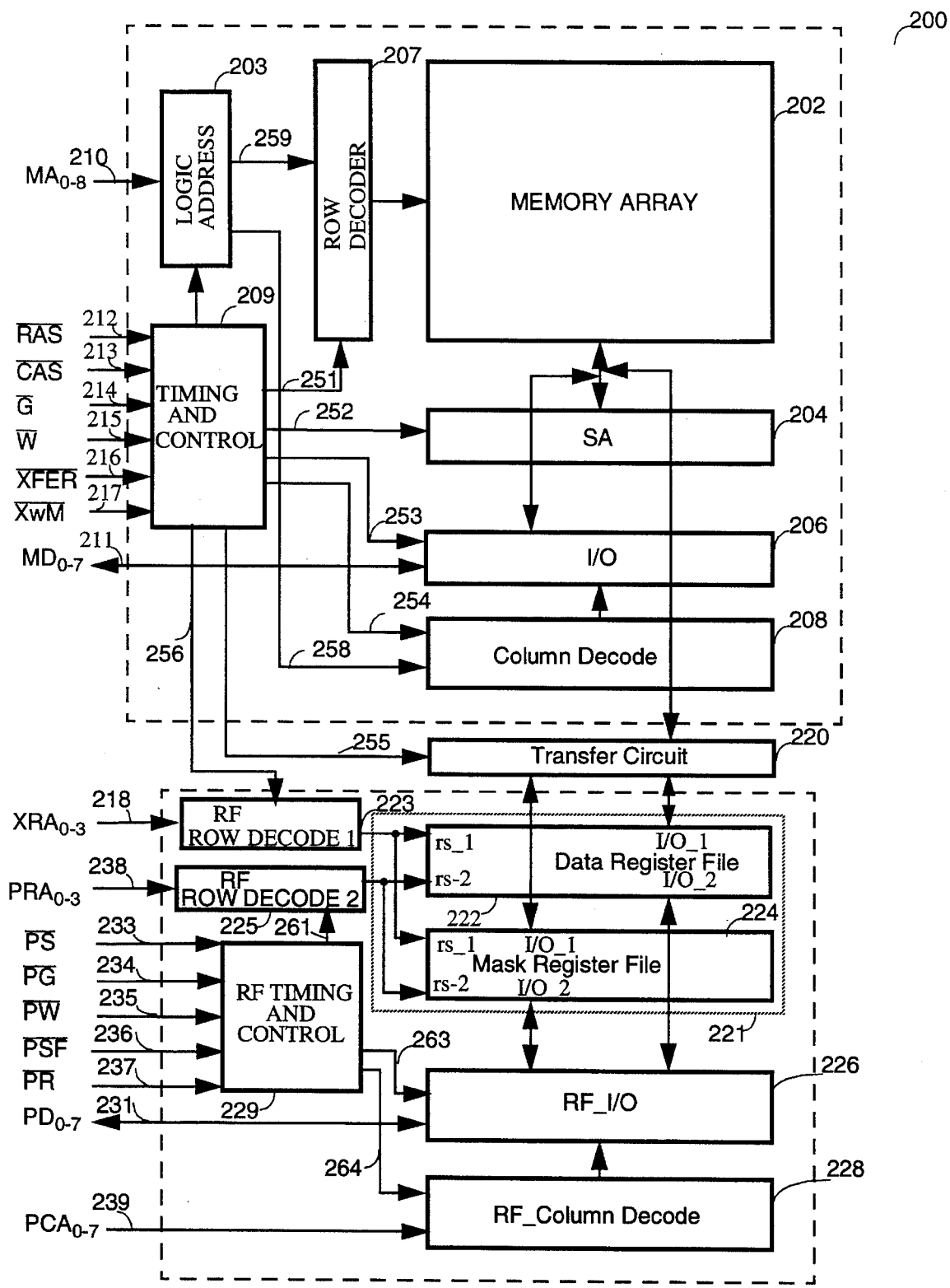
FIG. 4 is a block diagram showing the architecture of a memory device in accordance with one embodiment of the present invention.

Generally, memory such as random access memory(RAM) or read-only memory (ROM) is organized in rows and columns of storage locations. In block access applications, data transferred to and from memory is organized in blocks of sequential data. In such applications, the present invention increases system throughput and efficiency by allowing simultaneous accesses to the same block of memory data by external devices without corrupting data in adjacent blocks. An overall block diagram of the present invention is depicted in FIG. 4. All of the logic blocks shown in FIG. 4 reside in a semiconductor memory device 200.

Memory device 200 includes a memory array 202 having storage locations arranged in rows and columns. Although other types and sizes can be utilized without departing from the spirit of the invention, in the specific embodiment as depicted in FIG. 4 memory array 202 is a 128K word DRAM. Coupled to memory array 202 through transfer logic 220, there is a secondary memory 221 with rows and columns of storage locations wherein the width of each row of the secondary memory is the same as the width of a row in the main memory. Accesses to the memory array 202 are through a first interface 210–218 which is additionally used to transfer data between memory array 202 and secondary memory 221. A second interface 231–239 allows accessing secondary memory 221.

The first interface includes an address ($MA_{0-8}$) port 210, data input/output ($MD_{0-7}$) ports 211, a row address ($\overline{RAS}$) port 212, a column address strobe ($\overline{CAS}$) port 213, an output enable ($\overline{G}$) port 214, a write enable ($\overline{W}$) port 215, a transfer operation select ($\overline{XFER}$) port 216, a transfer with mask ($\overline{XwM}$) port 217, and a transfer row address ($XRA_{0-3}$) port 218.

The memory device 200 also includes control logic circuit 209 for generating timing and control signals during accesses to main memory 202, and for transfers between the main memory 202 and secondary memory 221 in response to the input terminals 210–218. Address port 210 ($MA_{0-8}$) is coupled to address logic 203 located in memory device 200. Address logic 203 provides row address information 259 to row decode logic 207 and column address information 258 to column decode logic 208. Further included in memory device 200 is a sense amplifier circuit 204 having a plurality of sense amplifiers connected to each column of array 202 and a data input/output circuit 206 coupled to data input/ output ($MD_{0-7}$) port 211. The forgoing architecture is common to many known dynamic RAMs.

The second interface 231–239 of the memory device 200 includes a second parallel-by-bit data input/output ($PD_{0-7}$) port 231, second row address ($PRA_{0-3}$) ports 238, second column address ($PCA_{0-8}$) ports 239. The second interface further includes a chip select ($\overline{PS}$) port 233, a second write enable ($\overline{PW}$) port 235, a second output enable ($\overline{PG}$) port 234, a function select ($\overline{PSF}$) port 236, and a reset ($\overline{PR}$) port 237.

The memory device 200 further includes a secondary memory 221 having a data register file 222, and a mask register file 224, and a control logic circuit 229 for controlling accesses to secondary memory 221 through data input/output port 231. Row decode circuit 225 selects a row of the secondary memory 221 during transfers between the secondary memory 221 and data input/output port 231, and row decode circuit 223 selects a row of the secondary memory during transfer between main memory 202 and the secondary memory 221. Input/output circuit 226 is coupled to column decode logic 228 and bidirectionally coupled to data I/O ($PD_{0-7}$) port 231.

The data register file 222 has a plurality of rows of dual port registers. Data register file 222 has two independent data I/O ports. Furthermore, data register file 222 is coupled to row decode logic blocks 223 and 225 through corresponding row select ports located in data register file 222. Mask register file 224 is also configured as a dual port register file including plurality of rows of dual port registers and having its own two independent data I/O ports. Additionally, mask register file 224 is coupled to row decode logic blocks 223 and 225 through its corresponding row select ports.

Address ($MA_{0-8}$) port 210 is coupled to the address logic 203. Outputs of the address logic 203 are coupled to the row decode circuit 207, and column decode circuit 208. The output of row decode circuit means 207 is coupled to the rows of the main memory 202. The column lines of the main memory means 202 are coupled to the sense amplifier circuit means 204, transfer circuit 220, and data I/O circuit 206. The output of column decode circuit 208 is coupled to data I/O circuit 206. Data I/O circuit means 206 is coupled to the first data input/output ports 211. Transfer circuit 220 is coupled between main memory 202 and secondary memory 221.

Control logic circuit 209 is coupled to ports 212–217 of the first interface. In FIG. 4 the coupling of the control logic circuit 209 to other components within the memory device 200 is represented diagrammatically by the output line 251, 252, 253, 254, 255, and 256. The output lines 251–256 represent the internal connections which are necessary to describe the structure and operation of this embodiment of the present invention.

The transfer row address ($XRA_{0-3}$) port 218 is coupled to row decode circuit 223. The output of the row decode circuit 223 is coupled to row select ports of the data register file 222, and first row select ports of the mask register file 224.

Row address ($PRA_{0-3}$) port 238 is coupled to row decode circuit 225. The output of row decode circuit 225 is coupled to row select ports of the data register file 222, and row select ports of the mask register file 224.

Data I/O ports of the data register file 222 are coupled to transfer circuit 220, additional I/O ports of the data register file 222 are coupled to data input/output circuit 226. Data I/O ports of the mask register file 224 is coupled to transfer circuit 220, additional I/O ports of the mask register file 224 are coupled to data input/output circuit 226.

Column address ($PCA_{0-7}$) ports 239 are coupled to column decode circuit 228. The output of column decode circuit 228 is coupled to data input/output circuit 226. Data input/output circuit 226 is coupled to data input/output ports 231.

Control logic circuit 229 is coupled to ports 233–237 of the second interface. In FIG. 4 the coupling of control logic circuit 229 to other components within the memory device 200 is represented diagrammatically by the output line 261, 263, and 264. The output lines 261, 263, and 264 represent the internal connections which are necessary to describe the structure and operation of this embodiment of the present invention.

The following description of the operation of the present inventions refers to the specific embodiment of the present invention shown in FIG. 4 and the timing diagrams shown in FIG. 9, and FIG. 10 *a–c*.

When the signal on operation select ($\overline{XFER}$) port 216 is deasserted (logic level high) on the falling edge of signal $\overline{RAS}$ on port 212, semiconductor memory 200 operates in a mode in which the main memory 202 and the secondary memory 221 operate independently and can be separately and independently accessed through the first and second interfaces respectively. In this mode the operation of main memory 202 is similar to commercially available DRAMs such as TMS48C128 from Texas Instruments Inc.

When the signal on the operation select ($\overline{XFER}$) port 216 is asserted (logic level low) on the falling edge of the signal on the $\overline{RAS}$ port 212, the semiconductor memory 200 operates in a transfer mode in which data is transferred between main memory 202 and secondary memory 221.

FIG. 9 shows the timing diagram for the transfer operation. Referring to FIG. 9, the transfer operation is invoked by low logic level signal on $\overline{XFER}$ port 216 on the falling edge of $\overline{RAS}$ 212. When the $\overline{RAS}$ 212 is asserted it specifies that both the first row address is valid on the first address ($MA_{0-8}$) ports 210 which selects a row of main memory 202, additionally the secondary memory row address is valid on the transfer row address ($XRA_{0-3}$) ports 218 selecting a row of secondary memory 221. The $\overline{RAS}$ 212 initiates the memory operation which causes the data in the form of capacitor charge from the specified row of the memory array 202 to be switched to the column lines. This row remains active until the $\overline{RAS}$ 212 is deasserted at the end of the memory cycle. The sense amplifiers sense the stored column charge and force the column voltage to a voltage corresponding to a logical '1' or '0' state based on the stored charge state. This also causes a refresh of the capacitor storage elements of the specified row of the memory array 202. In the transfer operation the write enable signal $\overline{W}$ 215 determines the transfer direction. When the $\overline{W}$ 215 is deasserted the data will be transferred from the selected row of the main memory array 202 to the selected row of the secondary memory 221. When the $\overline{W}$ 215 is asserted and $\overline{XwM}$ 217 is asserted on the falling edge of $\overline{W}$ 215 a combination of data from the selected row of data register file 222 will be transferred to the selected row of main memory array 202, wherein the combination is selected by the contents of the corresponding row of the mask register file 224. When the $\overline{W}$ 215 is asserted and $\overline{XwM}$ 217 is deasserted on the falling edge of $\overline{W}$ 215 data from the selected row of data register file 222 will be transferred to the selected row of main memory array 202 and the contents of the corresponding row of the mask register is ignored.

When $\overline{RAS}$ 212 is asserted after a certain address hold time the row address can be removed from memory address terminals and subsequently the column address can be applied to the memory address lines. When the column address is valid the $\overline{CAS}$ signal is asserted. During a transfer operation from memory array 202 to the secondary memory if the memory output enable $\overline{G}$ is asserted the word selected by the first column address will be driven on the first data input/output ports 211.

The functional operation of the secondary memory 221 as invoked by the control signals on $\overline{PS}$ port 233, $\overline{PG}$ port 234, $\overline{PW}$ port 235, $\overline{PSF}$ port 236, and $\overline{PR}$ port 237 are summarized in Table 1.

With signal on $\overline{PS}$ port 233 deasserted (logic level 1) no operation is selected. The signals on $PRA_{0-3}$ port 238 select one of the rows of the secondary memory 221. The signal on $PRA_3$ port selects either data register file or mask register file, and signals on $PRA_{0-2}$ ports select one of the 8 rows of the selected register file. The signals on $PCA_{0-7}$ port 239 select one of the words of the selected row of the secondary memory 221.

FIG. 10a shows the timing diagram for secondary memory 221 read and write operations. With signals on $\overline{PS}$ port 233 asserted (logic level 0), and $\overline{PW}$ port 235 deasserted (logic level 1), then after the latter of a $t_{AA}$ delay from valid address values on $PRA_{0-3}$ 238 and $PCA_{0-7}$ 239 or a $t_{OLZ}$ delay from the signal on $\overline{PG}$ port 234 asserted (logic level 0) the selected word from the secondary memory 221 will be driven on the $PD_{0-7}$ ports 231.

With signal on $\overline{PS}$ port 233 asserted (logic level 0), address signals on $PRA_{0-3}$ port 238 and $PCA_{O-7}$ port 239 must be valid for a minimum $t_{AS}$ before assertion of signal on $\overline{PW}$ port 235 and held valid until a minimum of $t_{AH}$ after negation of the signal on $\overline{PW}$ port 235, the signals on $PD_{0-7}$ ports 231 will be written to the selected word of the secondary memory, the signals on the $PD_{0-7}$ ports 231 must be valid a $t_{DS}$ before deassertion of signal on $\overline{PW}$ port 235 and held valid until a $t_{DH}$ after negation of signal on $\overline{PW}$ port 235.

FIG. 10b shows the timing diagram for secondary memory 221 simultaneous write operation. The simultaneous write operation is selected when in a write operation the signal on $\overline{PSF}$ port 236 is asserted (logic level 0) along with valid address signals on $PRA_{0-3}$ port 238 and $PCA_{0-7}$ port 239. In a simultaneous write operation both data register file and mask register file are selected, the signals on $PRA_{0-2}$ port select a row of the data register file and a corresponding row in the mask register file, the signals on $PCA_{0-7}$ port 239 select a word of the selected rows of data register file and mask register file, the signals on $PD_{0-7}$ port 231 is written to the selected word of the data register file and a first predetermined pattern is written to the corresponding word of the mask register file. The first predetermined pattern corresponds to a pattern that selects all the bits of a word during a transfer with mask from the secondary memory 221 to the main memory 202. In this specification the pattern consists of all 1s pattern.

FIG. 10c shows the timing diagram for secondary memory 221 write reset operation. The write reset operation is selected when in a write operation the signal on $\overline{PR}$ port 237 is asserted (logic level 0) along with valid address signals on $PRA0_{0-3}$ port 238 and $PCA_{0-7}$ port 239. In a write reset operation a second predetermined pattern is written to all the words of the selected row of the secondary memory 221. The second predetermined pattern corresponds to a pattern that deselects all the bits of a row during a transfer with mask from the secondary memory 221 to the main memory 202. In this specification the pattern consists of an all 0s pattern.

Memory operations as discussed above are summarized in the table below:

TABLE 1

| | | | | | Summary of second interface operations |
|---|---|---|---|---|---|
| $\overline{PS}$ | $\overline{PG}$ | $\overline{PW}$ | $\overline{PSF}$ | $\overline{PR}$ | Operation |
| 1 | X | X | X | X | No operation selected |
| 0 | 0 | 1 | X | X | Read operation |
| 0 | X | 0 | 1 | X | Write Operation |
| 0 | X | 0 | 0 | 1 | Simultaneous Write operation: Write to data register, and write the enable write mask pattern to the corresponding mask register |
| 0 | X | 0 | X | 0 | Write Reset operation: Reset the selected row of the secondary memory |

Figure 5:
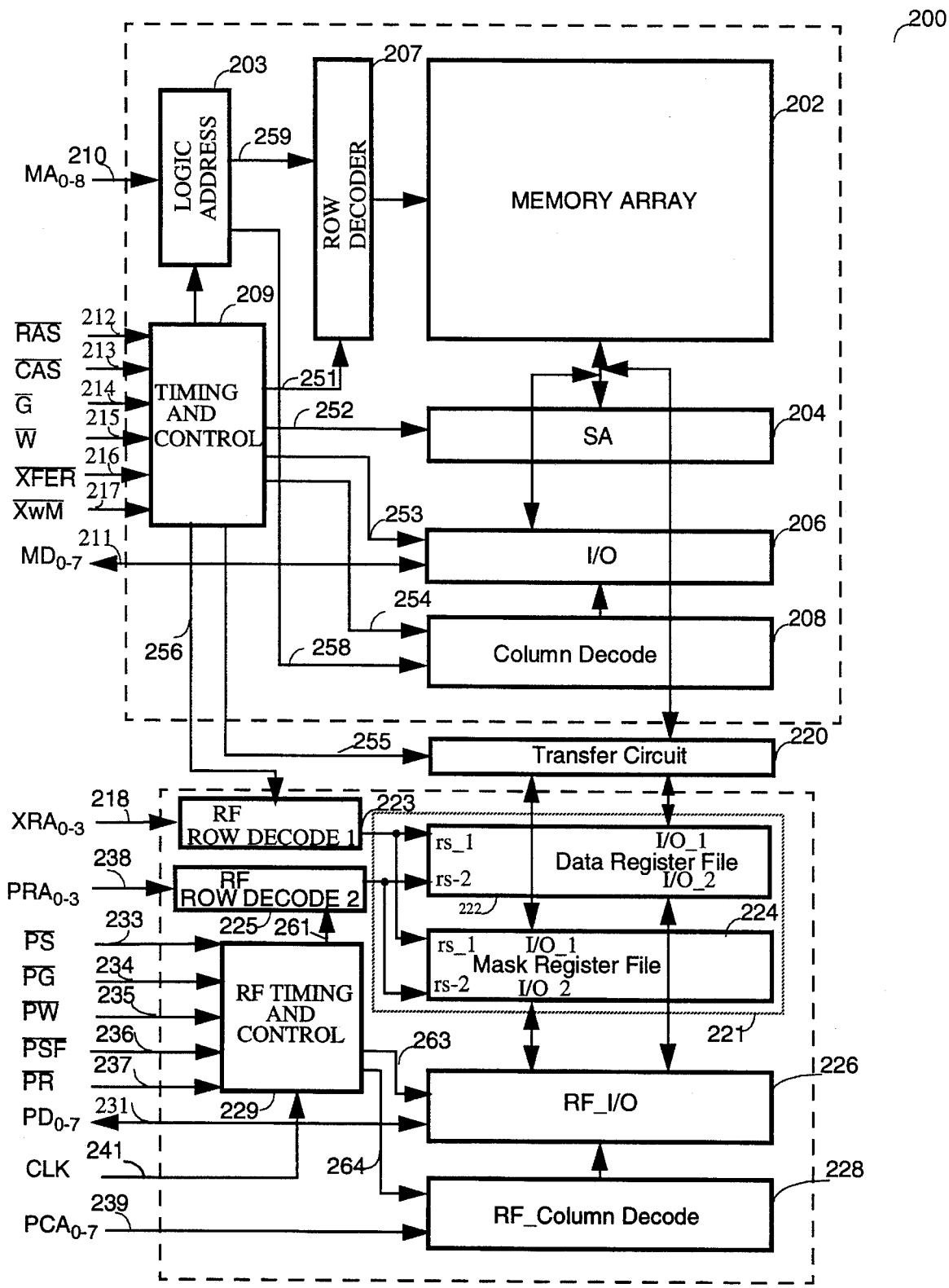
FIG. 5 is a block diagram of yet another embodiment of the invention having a clock (CLK) port wherein the operations through the second port are synchronized to the clock.

Referring now to FIG. 5, a clock (CLK) port 241 is added to the second interface and the operations (as summarized in table 1) of the second interface are synchronized with the signal on CLK port. All the address and control signals of the second interface are latched at the positive edge of the CLK. FIG. 11 illustrates an example of timing for synchronous read and write operation of second interface of memory device in FIG. 5.

In yet another embodiment of the invention shown in FIG. 6 the data register file and the mask register file use a single port register file structure. The use of a single port register file instead of a dual port register file reduces the size of the secondary memory 221. However the drawback is that the secondary memory cannot be accessed through the second interface simultaneously with transfers between secondary memory and main memory. Since such simultaneous operation is not possible anymore with a single port register file architecture, the pin count of the device can be reduced by eliminating $XRA_{0-3}$ port 218 as shown in FIGS. 4 and 5, and using $PRA_{0-3}$ port 238 during transfers between main memory and the secondary memory to provide the transfer address in the secondary memory. Furthermore with a single port register file structure a single register file row decode circuit means 223 is coupled to $PRA_{0-3}$ port 238. The use of single port register file reduces the cost of the secondary memory and reduces the pin count of the memory device but eliminates the flexibility of simultaneous operation.

In still another embodiment of the invention shown in FIG. 7 an address counter means 340 is used to provide the sequential column addresses for the secondary memory access through the second interface. The address counter means include a counter associated with each row of the data register files, which can be initialized through the second interface. An additional $PRA_4$ port on the second interface in conjunction with $PRA_3$ selects either data register file, mask register file, or the address counter, and signals on $PRA_{0-2}$ select one of 8 rows of the selected register file or one of the 8 counters of the address counter means. When the address counter means is selected the selected counter is accessed through signals on $PD_{0-7}$ port 231. When the register file is selected the column address is provided by the associated counter within the address counter means 340, the counter is incremented at the completion of the transfer cycle. The utility of this scheme is reduction of the memory device pins, by eliminating $PCA_{0-7}$.

In still another embodiment of the invention shown in FIG. 8 specifically for block access applications wherein all the block consist of plurality of complete rows of the main memory. In this specific embodiment, the mask register file 224, transfer with mask between the data register file and the main memory, and transfer with mask ($\overline{XwM}$) port 217 are eliminated to reduce the cost of the memory device.

I claim:

1. A memory device comprising:

a main memory having an array of memory cells arranged in rows and columns, each row for storing a plurality of words, corresponding bits of corresponding words being aligned in columns;

a first addressing means for selecting rows of the main memory;

a sense amplifier means corresponding to columns of the main memory;

a second addressing means for selecting memory locations corresponding to a prescribed word of a row;

a first input/output means for transferring data to or from memory locations selected by the first and second addressing means;

a first interface having parallel-by-bit data input/output ports, address ports, control ports, and transfer ports, said data input/output ports being coupled to the input/output means of the main memory;

a secondary memory having a data memory and a corresponding mask memory, the data memory having memory cells arranged in rows and columns wherein the number of words in a row of the data memory is the same as the number of words in a row of the main;

transfer circuit means coupled to main memory and said secondary memory for bidirectionally transferring words of data between a row of said main memory and a row of said secondary memory;

a second interface having parallel-by-bit data input/output ports, address ports, and a control port;

operation circuit means coupled to the second interface and the secondary memory for transferring words of data to and from the secondary memory simultaneously and independently of accesses to the main memory.

2. A random access memory according to claim 1 wherein said main memory is a dynamic random access memory.

3. A random access memory according to claim 1 wherein said control port of said second interface further includes a select port.

4. A random access memory according to claim 3 wherein said operation circuit further having means for writing a first predetermined pattern to a selected row of said mask memory concurrently with transferring words of data from said second interface data ports to the corresponding row of said data memory in response to a predetermined signal applied to said select port, wherein said first predetermined pattern corresponds to pre-selected bits of words in a row to be transferred from said data memory to said main memory.

5. A random access memory according to claim 1 wherein said said control port of said second interface further includes a reset port.

6. A random access memory according to claim 5 wherein said operation circuit further having means for writing a second predetermined pattern to a selected row of said mask memory concurrently with transferring words of data from said second interface data ports to said mask memory in response to a predetermined signal applied to said reset port, wherein said second predetermined pattern represents prohibiting the transfer of all of the bits of a row of said data memory to the main memory.

7. A random access memory according to claim 1 wherein said second interface includes a clock port for synchronizing memory operations through said second interface relative to a clock signal applied to the clock port.

8. A random access memory according to claim 1 wherein said operation circuit further includes:

(a) a third addressing means coupled to said second interface and to the secondary memory, for selecting each row of the secondary memory, (b) a fourth addressing means coupled to the second interface for selecting a word of said row, (c) a second input/output circuit means coupled to the secondary memory and further coupled to said data input/output ports of the second interface for accessing said selected word, (d) a logic circuit means for generating timing and control signals having output ports coupled to said third addressing means, said fourth addressing means, and the second input/output circuit means.

9. A random access memory according to claim 1 wherein said operation circuit further comprises:

(a) a plurality of address counters each associated with a row of said data memory and its corresponding mask memory each containing the address of the next accessible word within the row of said secondary memory;

(b) means to initialize the address counter with a start address, (c) a third addressing means coupled to said second interface and to said secondary memory for selecting a row of the secondary memory and its associated counter;

(d) a fourth addressing means coupled to said selected counter for selecting a word of selected row of said secondary memory;

(e) a second input/output circuit means coupled to said secondary memory and further coupled to input/output ports of said second interface for accessing said selected word;

(f) a logic circuit means for generating timing and control signals having output ports coupled to said third addressing means, said fourth addressing means, the second input/output circuit means, and the address counters.

10. A random access memory according to claim 1 wherein said memory cells are registers forming a register file.

11. A random access memory according to claim 10 wherein said register file is dual port wherein each of said registers of said register file having a first input/output port and a second input/output port.

12. A random access memory according to claim 10 wherein said registers of said register file coupled to a common input/output port form a single port register file.

13. A memory device comprising:

(a) a main memory having an array of memory cells arranged in rows and columns, each row for storing a plurality of words, corresponding bits of corresponding words being aligned in columns;

(b) a first addressing means for selecting rows of the main memory;

(c) a sense amplifier means corresponding to columns of the main memory;

(d) a second addressing means for selecting memory locations corresponding to a prescribed word of a row;

(e) a first input/output circuit means for transferring data to and from memory locations selected by the first and second addressing means;

(f) a first interface having parallel-by-bit data input/output ports, address ports, control ports, and transfer ports, said data input/output ports coupled to the input/output means of the main memory;

a secondary memory for storing data transferred to or from the main memory, the secondary memory comprising memory cells arranged in rows and columns, the rows of the first and secondary memories having the same number of storage locations;

transfer circuit means for bidirectionally transferring words of data between a row of said first memory and a row of said secondary memory;

a second interface having parallel-by-bit data input/output ports, address ports, and a control port; and operation circuit means coupled to the second interface and the secondary memory for transferring words of data to or from the secondary memory during and independently of accesses to the main memory.

14. A random access memory according to claim 13 wherein said main memory is a dynamic random access memory.

15. A random access memory according to claim 13 wherein said operation means comprises:

(a) a third addressing means coupled to said second interface and to said secondary memory for selecting each row of said secondary memory, (b) a fourth addressing means coupled to said second interface for selecting a word of said row, (c) a second input/output circuit means coupled to said secondary memory and further coupled to input/output ports of said second interface for accessing said selected word, (d) a logic circuit means having output ports coupled to said third and fourth addressing means and further coupled to said second input/output circuit means for generating timing and control signals.

16. A random access memory according to claim 13 wherein said secondary memory further having a data memory to store data transferred to and from said main memory and a corresponding mask memory to store a write mask corresponding to each word of the data memory.

17. A random access memory according to claim 13 wherein said control port of said second interface further includes a select port.

18. A random access memory according to claim 17 wherein said operation circuit further having means for writing a first predetermined pattern to a selected row of said mask memory concurrently with transferring words of data from said second interface data ports to the corresponding row of said data memory in response to a predetermined signal applied to said select port, wherein said first predetermined pattern corresponds to pre-selected bits of words in a row to be transferred from said data memory to said main memory.

19. A memory device comprising:

(a) a main memory having an array of memory cells having rows and columns to store a plurality of n-bit words, each row addressable by a first decoder, a sense amplifier for each column, each word selectable by a second decoder, said main memory having input/output capability to transfer data to and from said selected word;

(b) a first interface having parallel-by-bit data input/output ports coupled to the input/output of the main memory, said first interface further having address ports, control ports, and transfer ports;

(c) a secondary memory having a plurality of rows of memory cells each row having the same number of bits as a row of the main memory, said secondary memory further having a data memory to store data transferred to and from said main memory and a corresponding mask memory to store a write mask corresponding to each word of the data memory;

(d) transfer circuitry coupled to said main memory and to said secondary memory to move data from a row of main memory into a row of the secondary memory or to move any combination of words from a row of data memory into a row of main memory, wherein the combination is selected by the contents of the corresponding row in the mask memory;

(e) a second interface having parallel-by-bit data input/output ports, address ports and control port wherein data is transferred to and from said secondary memory through data ports of said second interface substantially independent of accesses to said first main memory.

20. A random access memory according to claim 19 wherein said second interface includes a select port.

21. A random access memory according to claim 20 wherein said operation circuit further having means for writing in response to a predetermined signal applied to said select port a first predetermined pattern to a word of said mask memory concurrently with transfer of signals on the input/output ports of the second interface to the corresponding word of said data memory, wherein said first predetermined pattern is a write mask value corresponding to selecting all bits of a word during transfer from data memory to the main memory.

22. A random access memory according to claim 19 wherein said second interface includes a reset port.

23. A random access memory according to claim 22 wherein said operation circuit further having means for writing a second predetermined pattern to a selected row of said mask memory concurrently with transferring words of data from said second interface data ports to said mask memory in response to a predetermined signal applied to said reset port, wherein said second predetermined pattern represents prohibiting the transfer of all of the bits of a row of said data memory to the main memory.

24. A random access memory according to claim 19 wherein said second interface includes a clock port.

25. A random access memory according to claim 24 wherein operations through said second interface are synchronized to signal on said clock port.

26. In a memory device having a main memory having an array of memory cells having rows and columns to store a plurality of n-bit words, each row addressable by a first decoder, a sense amplifier for each column, each word selectable by a second decoder, said main memory having input/output capability to transfer data to and from said selected word, and said main memory coupled to a first interface having data, address and control ports, a secondary memory coupled to a second interface having address, data and control ports, the secondary memory having a mask register file having the same number of columns as the main memory, a method for transferring information between the main memory and secondary memory comprising:

(a) in response to predetermined signals applied to the control port of the first interface selecting a row of the main memory and a row of the secondary memory;

(b) storing a predetermined pattern in a row of said mask register file corresponding to said selected row of said secondary memory; and (c) transferring a combination of words of said selected main memory row between said selected secondary memory row wherein said predetermined pattern stored in said selected mask memory row determines the combination of words for transferring.

27. The method as claimed in 26 wherein performing said selecting of a row of the main memory through the first interface.

28. The method as claimed in 26 wherein performing said selecting of a row of the secondary memory through the second interface.

* * * * *